United States Patent
Itonaga et al.

(10) Patent No.: US 7,759,706 B2
(45) Date of Patent: Jul. 20, 2010

(54) SOLID-STATE IMAGING DEVICE HAVING IMPURITIES WITH DIFFERENT DIFFUSION COEFFICIENTS

(75) Inventors: Kazuichiro Itonaga, Tokyo (JP); Suzunori Endo, Kanagawa (JP); Ikuo Yoshihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/252,909

(22) Filed: Oct. 18, 2005

(65) Prior Publication Data

US 2006/0081957 A1    Apr. 20, 2006

(30) Foreign Application Priority Data

Oct. 19, 2004    (JP) .................... P2004-303923

(51) Int. Cl.
H01L 31/062 (2006.01)
H01L 21/00 (2006.01)

(52) U.S. Cl. .............. 257/227; 257/216; 257/292; 257/E29.27; 438/48

(58) Field of Classification Search ............ 257/59, 257/72, 225, 232, 233, 258, 444, 290–293, 257/216, 219, E29.233, E29.27, E21.537–E21.539, 257/227
See application file for complete search history.

(56) References Cited

U.S. PATENT DOCUMENTS

| | | | | |
|---|---|---|---|---|
| 4,667,213 A | * | 5/1987 | Kosonocky | 257/219 |
| 5,396,096 A | * | 3/1995 | Akamatsu et al. | 257/336 |
| 5,998,828 A | * | 12/1999 | Ueno et al. | 257/315 |
| 6,188,094 B1 | * | 2/2001 | Kochi et al. | 257/232 |
| 6,207,518 B1 | * | 3/2001 | Akaishi et al. | 438/301 |
| 6,566,678 B1 | * | 5/2003 | Maeda et al. | 257/22 |
| 6,630,701 B1 | * | 10/2003 | Rhodes | 257/292 |
| 6,747,318 B1 | * | 6/2004 | Kapre et al. | 257/368 |
| 2005/0148114 A1 | * | 7/2005 | Rhodes | 438/120 |
| 2005/0167756 A1 | * | 8/2005 | Lotfi et al. | 257/369 |

FOREIGN PATENT DOCUMENTS

| | | |
|---|---|---|
| JP | 07-122733 | 5/1995 |
| JP | 11-075114 | 3/1999 |
| JP | 2002-051263 | 2/2002 |
| JP | 2005-286168 | 10/2005 |

* cited by examiner

Primary Examiner—Wael Fahmy
Assistant Examiner—Sarah K Salerno
(74) Attorney, Agent, or Firm—Robert J. Depke; Rockey, Depke & Lyons, LLC (57) ABSTRACT

The present invention provides a solid-state imaging device having an array of unit pixels, each unit pixel including a photoelectric conversion element and an amplifier transistor for amplifying a signal corresponding to charge obtained by photoelectric conversion through the photoelectric conversion element and outputting the resultant signal. The amplifier transistor includes a buried channel MOS transistor. According to the present invention, 1/f noise can be basically reduced.

16 Claims, 11 Drawing Sheets

SOLID-STATE IMAGING DEVICE HAVING IMPURITIES WITH DIFFERENT DIFFUSION COEFFICIENTS

CROSS REFERENCES TO RELATED APPLICATIONS

The present invention contains subject matter related to Japanese Patent Application JP 2004-303923 filed in the Japanese Patent Office on Oct. 19, 2004, the entire contents of which are incorporated herein by reference.

BACKGROUND OF THE INVENTION

1. Field of the Invention

The present invention relates to solid-state imaging devices and, more particularly, to an amplified solid-state imaging device in which each unit pixel including a photoelectric conversion element has an amplifier transistor for amplifying a signal corresponding to charge obtained by photoelectric conversion through the photoelectric conversion element and outputting the amplified signal.

2. Description of the Related Art

Solid-state imaging devices fall into two broad categories: charge-transfer solid-state imaging devices, typified by charge coupled device (CCD) image sensors, and amplified solid-state imaging devices, typified by metal oxide semiconductor (MOS) image sensors, such as a complementary MOS (CMOS) image sensor. The CCD image sensor needs a higher drive voltage to transfer signal charge than that for the MOS image sensor. Accordingly, a power supply voltage to the CCD image sensor is higher than that to the MOS image sensor.

In many cases, therefore, the MOS image sensor serves as a solid-state imaging device provided for a mobile device, such as a camera-equipped mobile phone or a personal digital assistant (PDA) because the MOS image sensor is more useful than the CCD image sensor in terms of lower power supply voltage and lower power consumption.

The CCD image sensor and the MOS image sensor will further be compared to each other. Although these image sensors have the same structure in which unit pixels each including a photoelectric conversion element are arranged in a two-dimensional matrix, the MOS image sensor does not use a vertical transfer CCD and a horizontal transfer CCD to read out signals from the unit pixels. In the MOS image sensor, charge accumulated in each of unit pixels is converted into an electric signal and the signal is then read to the corresponding signal line from the unit pixel, which is selected through the corresponding select line, made of an aluminium wire or a copper wire, in the same way as in a memory device.

As distinct from the CCD image sensor, in the MOS image sensor, each pixel includes an amplifying element (hereinafter, referred to as an amplifier transistor) for amplifying a signal. Japanese Unexamined Patent Application Publication No. 2002-51263 discloses a MOS image sensor with the above-mentioned structure. Another MOS image sensor of a recent type has a structure in which each amplifier transistor is shared by a plurality of pixels. In the above-mentioned MOS image sensors, if a gate insulating film of the amplifier transistor has any trap level, this trap level captures or releases electrons or holes that generate a current in the channel, thus resulting in a fluctuation in current. The current fluctuation causes noise.

In other words, in the MOS image sensor, when the amplifier transistor amplifies a signal, a trap level in the gate insulating film of the amplifier transistor causes noise whose power spectrum is proportional to the reciprocal of a frequency f, i.e., so-called 1/f noise (flicker noise). The 1/f noise occurred in the amplifier transistor adversely affects image quality.

Let K be a process dependent coefficient (coefficient regarding the capture or release of electrons at the interface of a gate insulating film), let Cox be the capacitance of the gate insulating film, let L denote the length of the channel (gate length) of a transistor, and let W be the width of the channel (the width of an active region). The power spectrum of 1/f noise (route mean square value of noise voltage) is obtained by the following Expression 1.

$$\overline{V_{n^2}} = \frac{K}{Cox} \cdot \frac{1}{W \cdot L} \cdot \int_1^{fc} \frac{1}{f} df \quad (1)$$

As will be obviously understood from Expression 1, the larger the gate insulating film capacitance Cox, the gate length L, and the active region width W of the amplifier transistor are, the smaller the 1/f noise becomes.

SUMMARY OF THE INVENTION

To mount a MOS image sensor on a compact mobile device, such as a camera-equipped mobile phone with one megapixel or more, the need for reducing the size of the MOS image sensor is increasing. As is clear from Expression 1, when the gate length L and the active region width W of the transistor decrease, 1/f noise increases. In advancing the reduction in size of the MOS image sensor, it is difficult to increase the gate length L and the active region width W of the transistor in order to reduce the 1/f noise.

Voltage to read a signal from a pixel is applied to the gate electrode of each amplifier transistor. The higher the voltage is, the easier the signal can be read from the pixel. Accordingly, the voltage is set to a high value, i.e., 2.5 V or higher, generally, 3.3 V. Therefore, since easily reducing the thickness of the gate insulating film is difficult in terms of the reliability of the gate insulating film, there is also a limit to the reduction in 1/f noise by increasing the gate insulating film capacitance Cox in the foregoing Expression 1.

The present invention is made in consideration of the above disadvantages. It is desirable to provide a solid-state imaging device which is basically capable of reducing 1/f noise without increasing the gate length L, the active region width W, and the gate insulating film capacitance Cox of a transistor.

According to an embodiment of the present invention, there is provided a solid-state imaging device having an array of unit pixels. Each unit pixel includes a photoelectric conversion element and an amplifier transistor for amplifying a signal corresponding to charge obtained by photoelectric conversion through the photoelectric conversion element and outputting the resultant signal. The amplifier transistor is a buried channel MOS transistor.

BRIEF DESCRIPTION OF THE DRAWINGS

FIG. 11 shows the present invention applied to a solid-state image device such like a camera or the like.

DESCRIPTION OF THE PREFERRED EMBODIMENTS

An embodiment of the present invention will now be described in detail hereinbelow with reference to the drawings.

Figure 1:
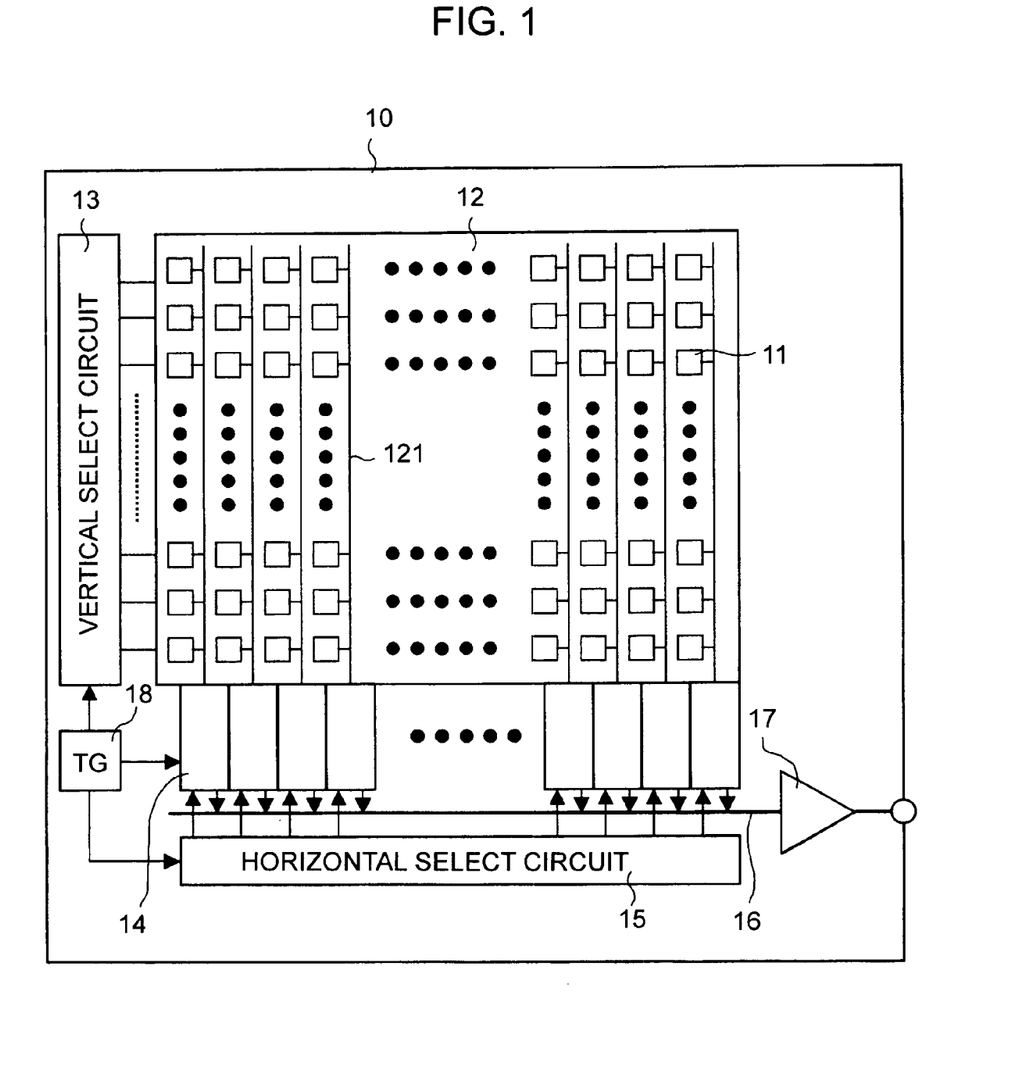
FIG. 1 is a block diagram of the structure of a MOS image sensor according to an embodiment of the present invention.

FIG. 1 is a block diagram of the structure of an amplified solid-state imaging device, such as a MOS image sensor, according to an embodiment of the present invention. Referring to FIG. 1, a MOS image sensor 10 according to the present embodiment serves as an area sensor including: a pixel array 12 having unit pixels 11 arranged in a two-dimensional matrix, each unit pixel 11 including a photoelectric conversion element, such as a photodiode; a vertical select circuit 13, column circuits 14, each serving as a signal processing circuit; a horizontal select circuit 15; a horizontal signal line 16; an output circuit 17; and a timing generator (TG) 18.

In the pixel array 12, a vertical signal line 121 is arranged every column of the pixel matrix. The detailed circuit configuration of each unit pixel 11 will be described below. The vertical select circuit 13 includes shift registers and sequentially outputs control signals, such as transfer signals for driving a transfer transistor 112 of the unit pixel 11 or reset signals for driving a reset transistor 113, every row to drive the respective pixels 11 in the pixel array 12 every row.

The column circuit 14, serving as the signal processing circuit, is arranged every column in the pixel array 12, i.e., every vertical signal line 121. Each column circuit 14 includes, e.g., sample-and-hold (S/H) circuits, or a correlated double sampling (CDS) circuit. The horizontal select circuit 15 includes shift registers. The horizontal select circuit 15 sequentially selects signals output from the respective pixels 11 through the column circuits 14 and output the signals to the horizontal signal line 16. In FIG. 1, horizontal select switches are not shown for the sake of simplicity. The horizontal select circuit 15 sequentially turns on or off the horizontal select switch arranged every column.

By the driving operation of the horizontal select circuit 15, signals of the unit pixels 11 are sequentially output from the corresponding column circuit 14 every column and are supplied through the horizontal signal line 16 to the output circuit 17. The signals are subjected to signal processing, e.g., amplification by the output circuit 17 and are then output from the device. The TG 18 generates various timing signals and drives the vertical select circuit 13, the column circuits 14, and the horizontal select circuit 15 using those timing signals.

Figure 2:
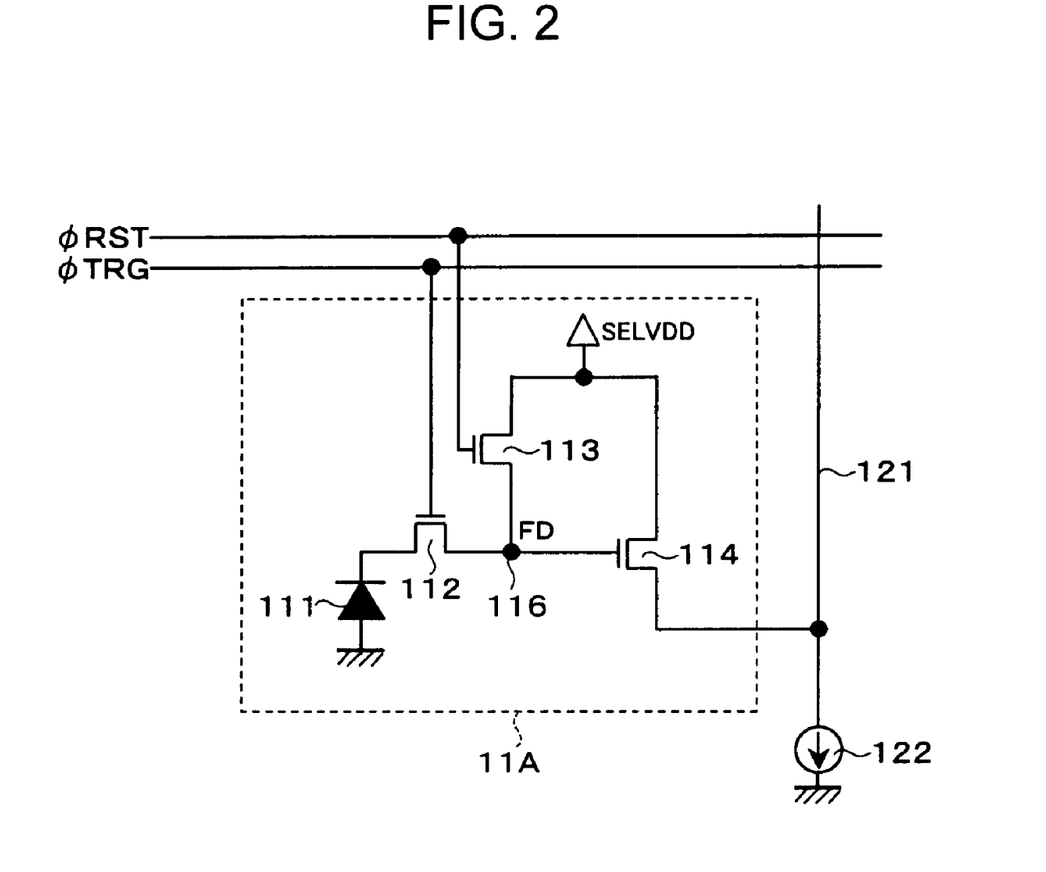
FIG. 2 is a circuit diagram of the circuit configuration of each unit pixel.

FIG. 2 is a circuit diagram showing an example of the circuit configuration of each unit pixel 11. Referring to FIG. 2, in this example, in addition to the photoelectric conversion element, such as a photodiode 111, a unit pixel 11A includes three transistors, e.g., the transfer transistor 112, the reset transistor 113, and an amplifier transistor 114. In this example, e.g., N channel MOS transistors are used as the transistors 112 to 114.

The transfer transistor 112 is connected between the cathode of the photodiode 111 and a floating diffusion (FD) region 116. When a transfer pulse φTRG is supplied to the gate of the transfer transistor 112, the transfer transistor 112 transfers signal charge (electrons), obtained by photoelectric conversion through the photodiode 111 and accumulated in the transfer transistor 112, to the FD region 116.

The drain of the reset transistor 113 is connected to a select power supply SELVDD and the source thereof is connected to the FD region 116. When a reset pulse φRST is supplied to the gate of the reset transistor 113 prior to the transfer of signal charge from the photodiode 111 to the FD region 116, the reset transistor 113 resets the potential of the FD region 116. The power supply voltage of the select power supply SELVDD is selectively switched between a VDD level and a GND level.

The amplifier transistor 114 has such a source follower configuration that the gate of the amplifier transistor 114 is connected to the FD region 116, the drain thereof is connected to the select power supply SELVDD, and the source thereof is connected to the vertical signal line 121. When the power supply voltage of the select power supply SELVDD goes to the VDD level, the amplifier transistor 114 turns on, so that the unit pixel 11A is selected. The potential of the FD region 116 reset by the reset transistor 113 indicates a reset level. The amplifier transistor 114 outputs a signal indicative of the reset level potential to the vertical signal line 121. After the transfer transistor 112 transfers signal charge to the FD region 116, the potential of the FD region 116 indicates a signal level. The amplifier transistor 114 further outputs a signal indicative of the signal level potential to the vertical signal line 121.

Figure 3:
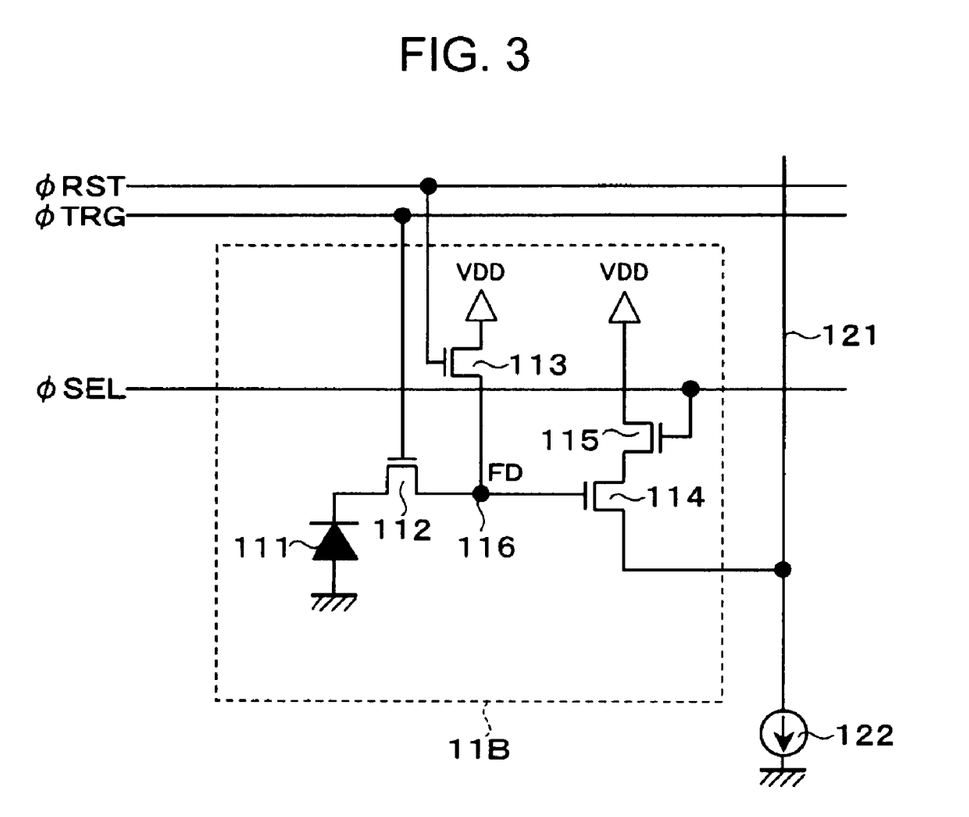
FIG. 3 is a circuit diagram of another circuit configuration of each unit pixel.

FIG. 3 is a circuit diagram showing an example of another circuit configuration of each unit pixel 11. In this example, referring to FIG. 3, in addition to the photoelectric conversion element, e.g., the photodiode 111, a unit pixel 11B has four transistors, i.e., the transfer transistor 112, the reset transistor 113, the amplifier transistor 114, and a select transistor 115. For example, N channel MOS transistors serve as the transistors 112 to 115.

The transfer transistor 112 is connected between the cathode of the photodiode 111 and the FD region 116. When a transfer pulse φTRG is supplied to the gate of the transfer transistor 112, the transfer transistor 112 transfers signal charge (electrons), obtained by photoelectric conversion through the photodiode 111 and accumulated in the transfer transistor 112, to the FD region 116.

The drain of the reset transistor 113 is connected to a power supply VDD and the source thereof is connected to the FD region 116. When a reset pulse φRST is supplied to the gate of the reset transistor 113 prior to the transfer of signal charge from the photodiode 111 to the FD region 116, the reset transistor 113 resets the potential of the FD region 116.

The drain of the select transistor 115 is connected to another power supply VDD and the source thereof is connected to the drain of the amplifier transistor 114. When a select pulse φSEL is supplied to the gate of the select transistor 115, the select transistor 115 turns on, so that the select transistor 115 supplies a power supply voltage VDD to the amplifier transistor 114. Thus, the pixel 11B is selected. The select transistor 115 can be arranged in another pattern, i.e., the select transistor 115 can be connected between the source of the amplifier transistor 114 and the vertical signal line 121.

The amplifier transistor 114 has such a source follower configuration that the gate of the amplifier transistor 114 is connected to the FD region 116, the drain thereof is connected to the source of the select transistor 115, and the source thereof is connected to the vertical signal line 121. The amplifier transistor 114 outputs a signal indicative of the reset level potential of the FD region 116 reset by the reset transistor 113 to the vertical signal line 121. Further, after the transfer transistor 112 transfers signal charge to the FD region 116, the amplifier transistor 114 outputs a signal indicative of the signal level potential of the FD region 116 to the vertical signal line 121.

In each of the unit pixel 11A having three transistors and the unit pixel 11B including four transistors, the analog operation is performed such that signal charge obtained by photoelectric conversion through the photodiode 111 is transferred through the transfer transistor 112 to the FD region 116, the potential of the FD region 116 corresponding to the signal charge is amplified by the amplifier transistor 114, and a signal indicative of the amplified potential is output to the vertical signal line 121. In a pixel circuit operating in an analog manner, if the channel length of each of the transistors including the amplifier transistor 114 is short, the threshold voltage Vth fluctuates due to the short channel effect. Therefore, long-channel-length MOS transistors are used as the transistors including the amplifier transistor 114.

According to the present invention, each unit pixel 11 (11A/11B) with the above-mentioned configuration includes a buried channel MOS transistor, serving as the amplifier transistor 114. According to the present embodiment of the present invention, each unit pixel 11 includes an N channel MOS transistor (hereinafter, referred to as an NMOS transistor), serving as the amplifier transistor 114. According to the present embodiment, since an NMOS transistor serves as the amplifier transistor 114, an N type corresponds to a first conductivity type and a P type corresponds to a second conductivity type.

Figure 4:
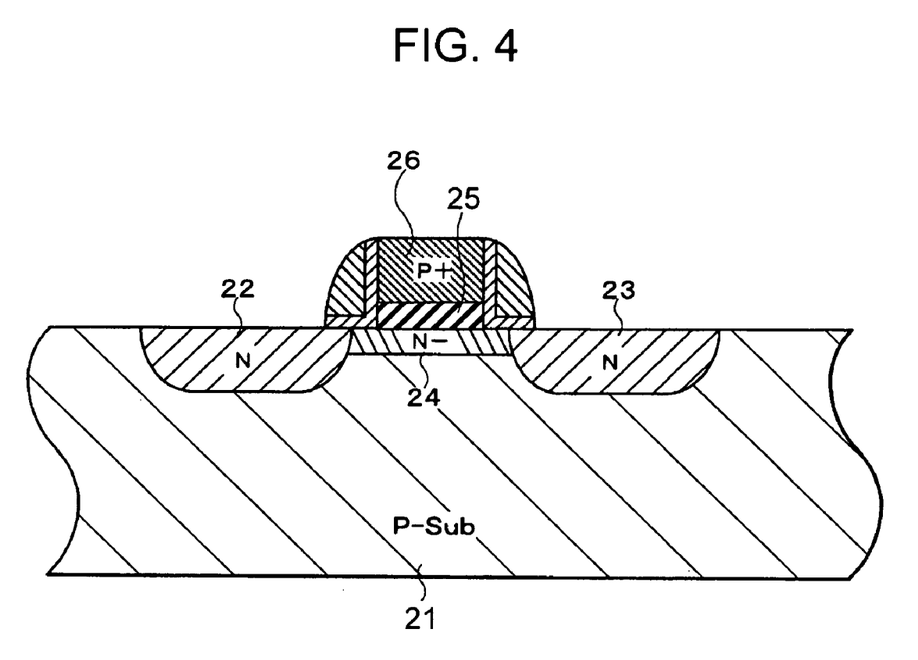
FIG. 4 is a sectional view of the structure of a buried channel NMOS transistor.

FIG. 4 is a sectional view of the structure of a buried channel NMOS transistor. Referring to FIG. 4, in the surface of a P type semiconductor substrate 21, N type diffusion layers 22 and 23, respectively serving as a drain region and a source region, are formed at a predetermined distance from each other. In addition, N type atoms, such as phosphorus (P), are implanted into a region between the diffusion layers 22 and 23 in the vicinity of the substrate surface, i.e., the channel region, thus forming an N− type layer 24. A gate electrode 26 made of P+ type polysilicon is formed on the substrate surface between the diffusion layers 22 and 23, with a gate insulating film 25 made of, e.g., $SiO_2$ therebetween.

Figure 5:
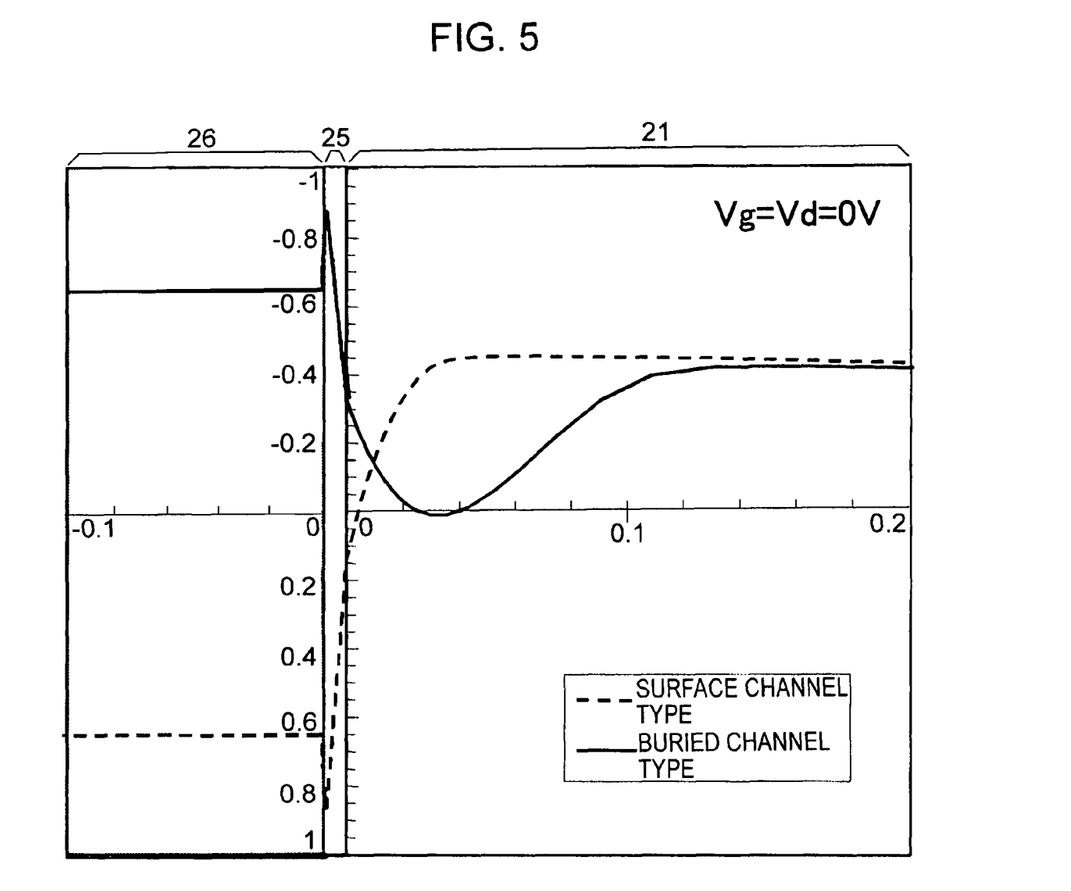
FIG. 5 shows the potential profile with depth of the gate channel region of a general surface channel NMOS transistor and that of a general buried channel NMOS transistor.

FIG. 5 shows the potential profiles of general surface channel and buried channel NMOS transistors, each potential profile being along the depth in the gate channel region of the transistor.

As is clear from the potential profiles, regarding a region where the potential of the semiconductor substrate (silicon substrate) is minimized, i.e., a region where a current flows, in the case of the surface channel NMOS transistor, the region is formed at the interface between the gate insulating film and the substrate. On the other hand, in the case of the buried channel NMOS transistor, the region is formed separately from the gate insulating film, i.e., inside the substrate. Assuming that any trap level capturing or releasing electrons or holes exists at the interface between the gate insulating film and the substrate in each transistor, the surface channel NMOS transistor is more severely affected by the trap level than the buried channel NMOS transistor.

As will be obviously understood from the above description, when the buried channel NMOS transistor is used as the amplifier transistor 114 in each unit pixel 11 of the MOS image sensor 10, the region where the potential of the substrate 21 is minimized (i.e., a current flows) is formed not at the interface between the gate insulating film 25 and the substrate 21 but at a distance from the gate insulating film 25, i.e., inside the substrate 21. Consequently, if any trap level capturing or releasing electrons or holes exists at the interface between the gate insulating film and the substrate, the effect of the trap level on a current flowing through the channel can be inhibited.

In other words, the use of the buried channel NMOS transistor as the amplifier transistor 114 can prevent a fluctuation in current which is caused by a trap level and leads to the generation of 1/f noise. Therefore, the 1/f noise can be basically reduced without increasing the gate length (gate dimension) L, the gate width (i.e., the dimension of the active region), the capacitance Cox of the gate insulating film of the amplifier transistor 114.

Again referring to FIGS. 2 and 3, the end of the vertical signal line 121 is connected to a constant current source 122. Generally, the constant current source 122 includes a MOS transistor (load MOS transistor) with a large channel width W. When the type of load MOS transistor is the same as that of the amplifier transistor 114, therefore, the amplifier transistor 114 dominates 1/f noise. In this point of view, it is useful for the MOS image sensor 10 to include a buried channel MOS transistor as the amplifier transistor 114.

It is known that buried channel MOS transistors are easily affected by the short channel effect that is caused by a reduction in the channel length (gate length). Since each unit pixel 11 operates in an analog manner as mentioned above, a MOS transistor with a long channel length is used as the amplifier transistor 114. Consequently, a buried channel MOS transistor that is easily affected by the short channel effect can be used as the amplifier transistor 114.

Figure 6:
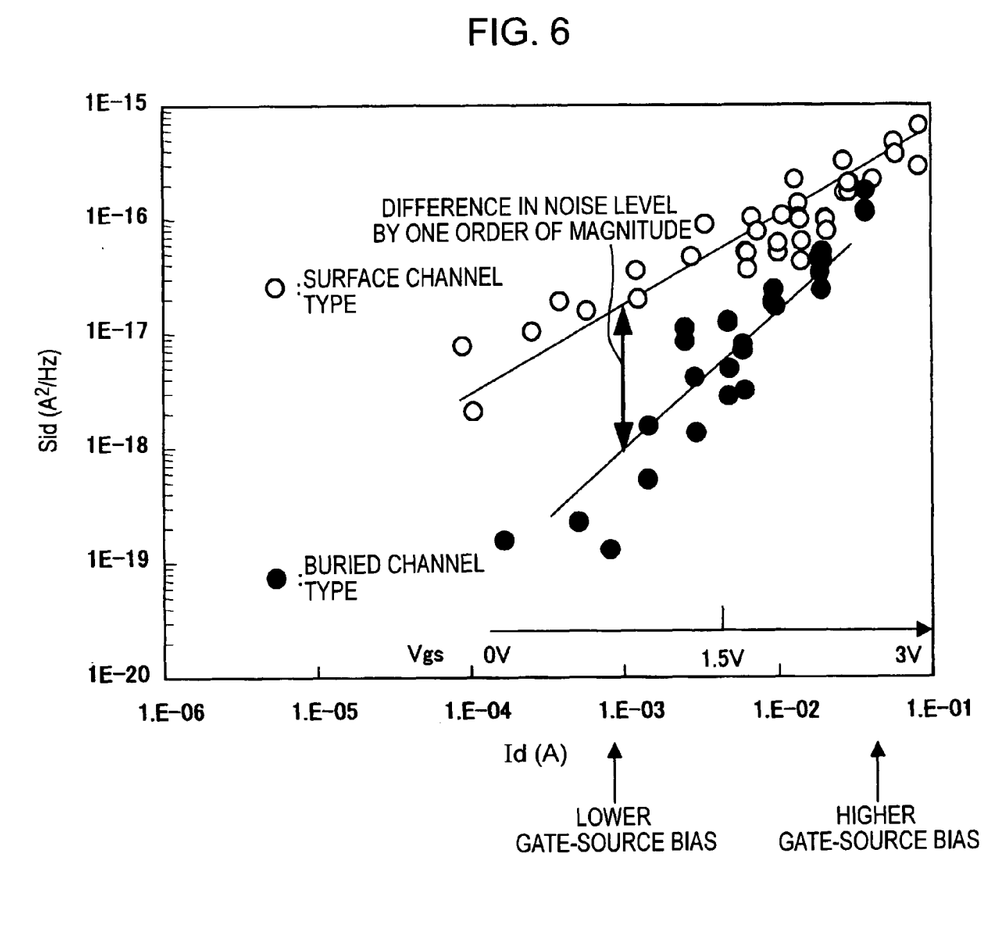
FIG. 6 shows an example of the comparison in 1/f noise between the buried channel NMOS transistor and the surface channel NMOS transistor.

FIG. 6 shows an example of the comparison in 1/f noise between the buried channel NMOS transistor and the surface channel NMOS transistor.

As will be obviously understood from FIG. 6, the higher the gate-source bias is, the more current flows at the interface between the gate insulating film and the substrate. When the gate-source bias is high, 1/f noise generated in the buried channel NMOS transistor has the same level as that in the surface channel NMOS transistor. Specifically, when the gate-source bias is higher than 1.5 V, the 1/f noise level of the buried channel NMOS transistor is equivalent to that of the surface channel NMOS transistor.

In other words, when the gate-source bias is equal to or less than 1.5 V, the 1/f noise level of the buried channel NMOS transistor is lower than that of the surface channel NMOS transistor. When the gate-source bias is about 1.0 V, the 1/f noise level of the buried channel NMOS transistor differs from that of the surface channel NMOS transistor by an order of magnitude. Therefore, preferably, the gate-source bias in the buried channel NMOS transistor is equal to or less than 1.5 V.

Figure 7:
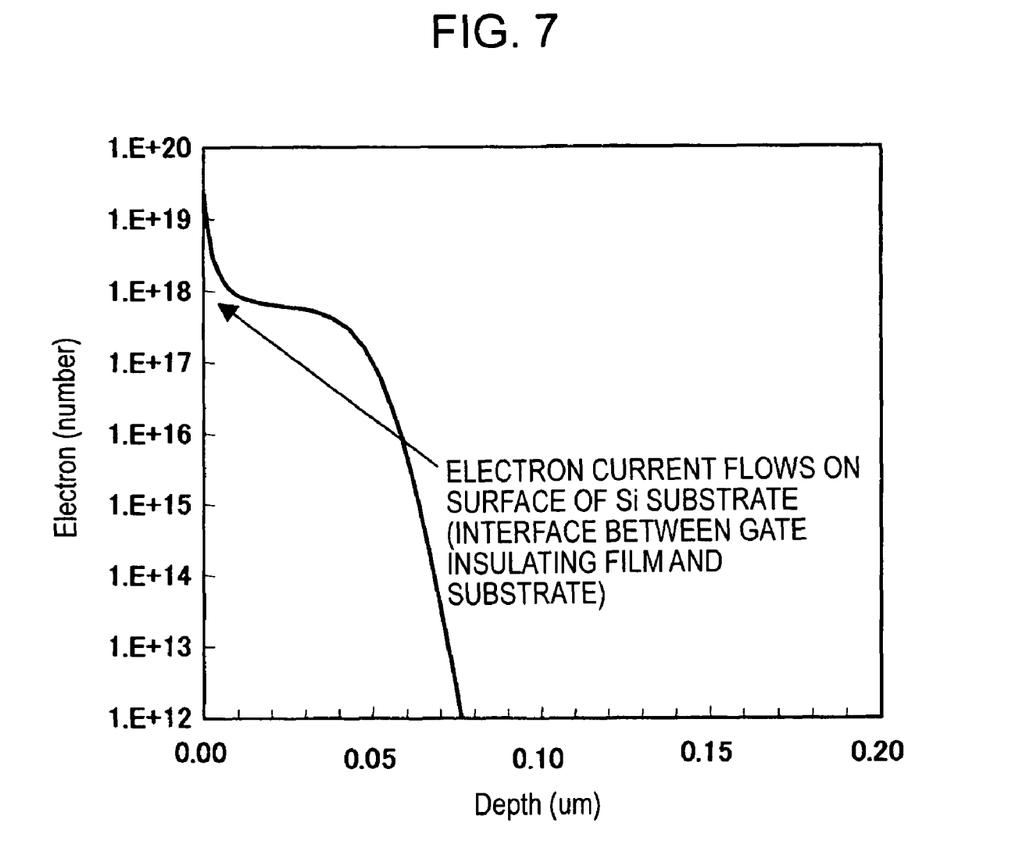
FIG. 7 shows the characteristic of electron current flowing when the source follower operation is not performed.

The reason why the 1/f noise level of the buried channel NMOS transistor is equivalent to that of the surface channel NMOS transistor when the gate-source bias is higher than 1.5 V is as follows: Even in the buried channel NMOS transistor, as the gate-source bias is higher, the minimum-potential region (channel region) below the gate is closer to the surface. As shown in FIG. 7, a current flows at the interface between the gate insulating film and the substrate.

Figure 8:
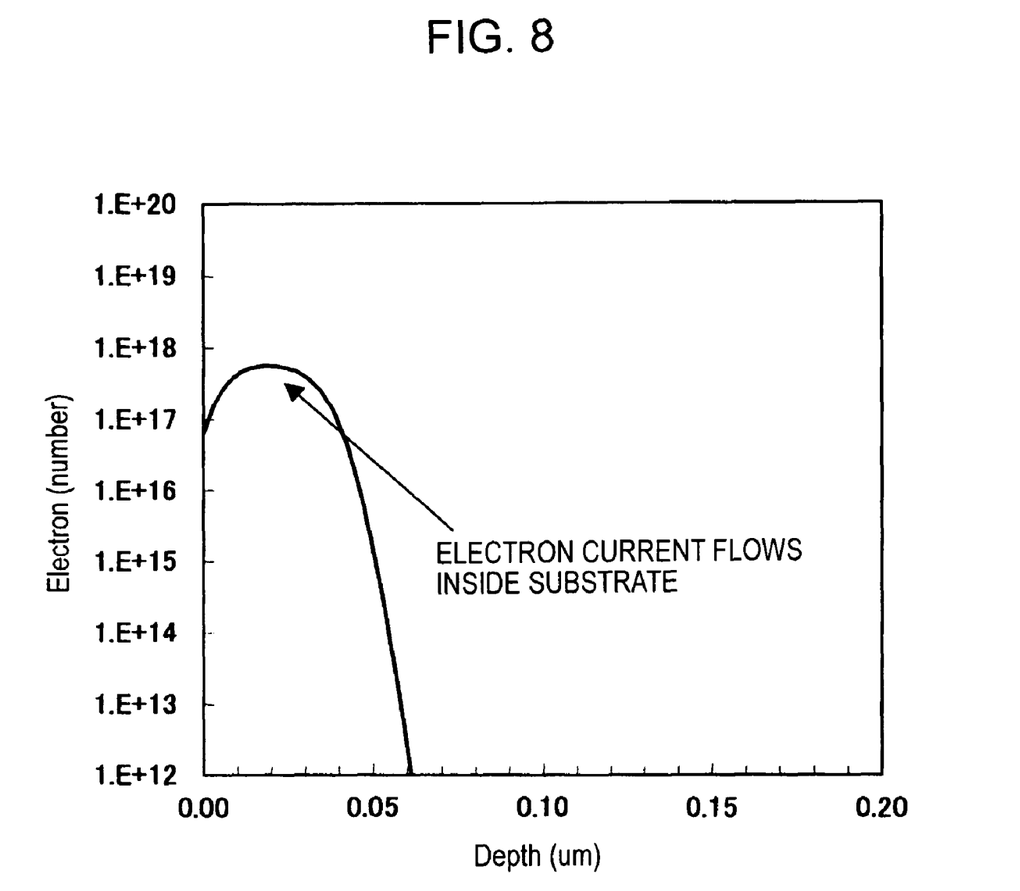
FIG. 8 shows the characteristic of electron current flowing when the source follower operation is performed.

On the contrary, according to the present embodiment, since each unit pixel 11 (11A/11B) includes the amplifier transistor 114 with a source follower configuration as mentioned above, the unit pixel 11 has the large advantage of reducing 1/f noise. The reason is as follows: In a source follower circuit, a gate-source bias is low. When a buried channel MOS transistor is used as the amplifier transistor 114 with a source follower configuration, a current flows inside the substrate, i.e., below the interface between the gate insulating film and the substrate as shown in FIG. 8. Thus, the buried channel characteristics can be enhanced. Therefore, 1/f noise can be reliably reduced.

To keep the buried channel characteristics upon applying the gate-source bias, the dose of an N type impurity to be implanted into the channel region has to be equal to or higher than $1\times10^{19}$ (atoms/cm$^3$).

Figure 9:
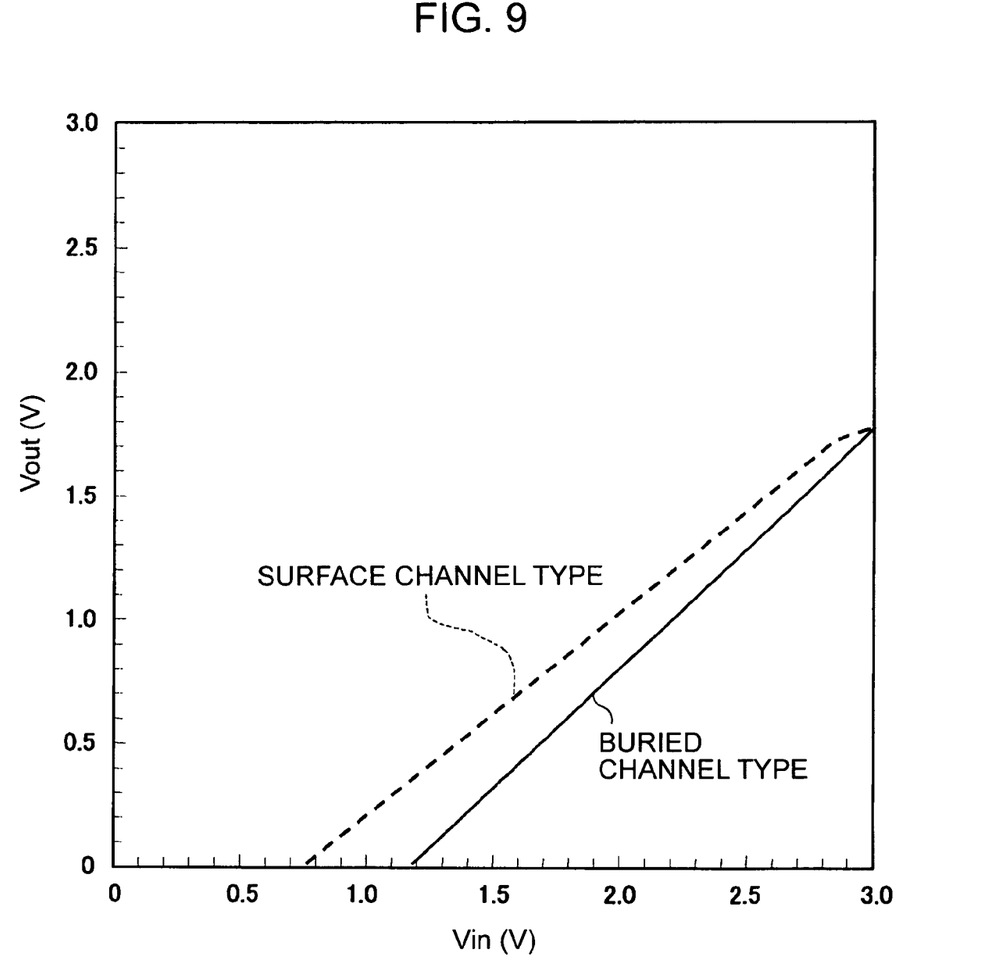
FIG. 9 shows the input-output characteristic obtained when a surface channel NMOS transistor is used as an amplifier transistor with a source follower configuration and that obtained when a buried channel NMOS transistor is used as the amplifier transistor with a source follower configuration.

FIG. 9 shows the input-output characteristic obtained when a surface channel NMOS transistor is used as the amplifier transistor 114 with a source follower configuration and that obtained when a buried channel NMOS transistor is used as the amplifier transistor 114 with the above configuration.

As will be obviously understood from FIG. 9, the linearity of the characteristic between an input signal Vin and an output signal Vout of the buried channel NMOS transistor is better than that of the surface channel NMOS transistor.

In buried channel MOS transistors, the mobility μ is high because the mobility μ is not affected by roughness at the interface between the gate insulating film and the substrate, thus resulting in an increase of transfer conductance gm whose parameters include the mobility μ. Consequently, the slope of Vout/Vin (=gm/(gm+gds+gmbs) is increased, where gds denotes output conductance and gmbs denotes a proportionality coefficient of the substrate bias effect.

In particular, in the amplifier transistor 114 including a buried channel NMOS transistor, the gate electrode 26 is not an N+ type but a P+ type. Thus, the P+ type gate electrode 26 can allow the cannel region to be a depletion region. Advantageously, the buried channel characteristics can be further enhanced, so that the slope of Vout/Vin can be increased. The large slope of Vout/Vin means a wide dynamic range and a high output sensitivity.

As mentioned above, since the P+ type gate electrode 26 of the amplifier transistor 114 realizes a wide dynamic range and a high output sensitivity, the operating point at the input of a downstream signal processing system, i.e., the corresponding column circuit 14 (see FIG. 1) can be easily set. In addition, there is no fluctuation in leakage current in the OFF state. Advantageously, vertical noise hardly occurs. Consequently, even when the gain is increased in a dark scene, a high-quality image can be obtained with a low noise.

In addition, in implanting an N type impurity into the channel region in order to form the amplifier transistor 114, serving as a buried channel MOS transistor, the more enhanced buried channel characteristics can be obtained by implanting at least two kinds of N type impurities having different diffusion coefficients than by implanting one N type impurity. Regarding at least two kinds of N type impurities having different diffusion coefficients, e.g., arsenic (As) and phosphorus (P) are available.

Figure 10:
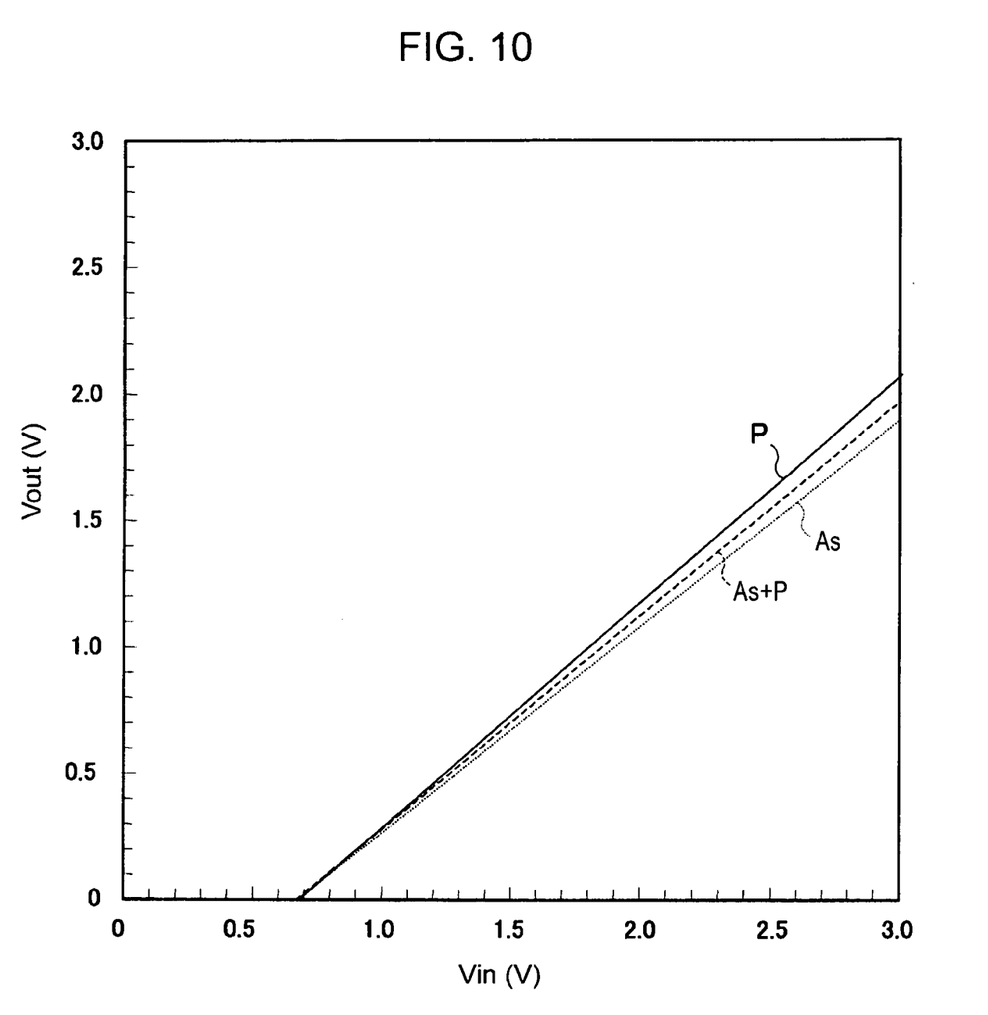
FIG. 10 shows the input-output characteristic obtained when a buried channel NMOS transistor containing phosphorus as an impurity for a buried channel is used as the amplifier transistor with a source follower configuration, that obtained when a buried channel NMOS transistor containing arsenic as a channel impurity is used as the amplifier transistor with a source follower configuration, and that obtained when a buried channel NMOS transistor containing phosphorus and arsenic as channel impurities is used as the amplifier transistor with a source follower configuration.

FIG. 10 shows the input-output characteristics of three types of buried channel NMOS transistors, each serving as the amplifier transistor 114 with a source follower configuration. In the first type, only phosphorus was implanted into the channel region. In the second type, only arsenic was implanted. In the third type, phosphorus and arsenic were implanted.

As is clear from FIG. 10, the linearity of the input-output characteristic is better (i.e., the slope thereof is larger) in the order of the first type, the second, type, and the third type (i.e., the first type>the second type>the third type). The reason is that the mutual conductance is better in the order of the first type, the second type, and the third type (i.e., the first type>the second type>the third type).

In implanting phosphorus and arsenic as two kinds of N type impurities having different diffusion coefficients, arsenic having a lower diffusion coefficient is distributed such that the density of arsenic is higher than that of phosphorus having a higher diffusion coefficient in a region close to the gate insulating film 25. Accordingly, while the peak of the potential profile is formed in the depth of the gate channel region by arsenic, the N type region can be broaden up to a deep portion in the substrate by phosphorus. Thus, a buried channel can be formed with good short-channel characteristics.

Alternatively, in implanting phosphorus and arsenic as two kinds of N type impurities having different diffusion coefficients, arsenic with a lower diffusion coefficient can be distributed such that the density of arsenic is higher than that of phosphorus having a higher diffusion coefficient in a region far from the gate insulating film 25. In this diffusion pattern, although the short channel characteristics are lower than those of the foregoing pattern, 1/f noise can be reduced with higher reliability by forming the channel in a deeper position than that of the above pattern.

The above-mentioned technique of using a buried channel NMOS transistor as the amplifier transistor 114 can be applied to each of the unit pixel 11A having three transistors shown in FIG. 2 and the unit pixel 11B having four transistors in FIG. 3. Similarly, the advantage of reducing 1/f noise can be obtained in each of the unit pixels 11A and 11B.

In particular, when a buried channel NMOS transistor having a P+ type gate electrode is applied to the amplifier transistor 114 in the unit pixel 11B with four transistors shown in FIG. 3, the following operating effects can be obtained.

In a pixel circuit of the unit pixel 11B, the select transistor 115 is connected to the amplifier transistor 114 such that the select transistor 115 is closer to the power supply VDD than the amplifier transistor 114. Let Vtha denote the threshold voltage of the amplifier transistor 114 and let Vths be the threshold voltage of the select transistor 115. To prevent a voltage drop in the select transistor 115, it is necessary to satisfy the following condition: Vths<Vtha.

Under the above condition, if a buried channel NMOS transistor having an N+ type gate electrode is applied to the amplifier transistor 114, the threshold voltage Vtha of the amplifier transistor 114 becomes lower. The threshold voltage Vths of the select transistor 115 has to be lower than the threshold voltage Vtha. Unfortunately, the select transistor 115 is always in the ON state, so that the corresponding pixel is not selected.

According to the present embodiment, since a buried channel NMOS transistor having a P+ type gate electrode is applied to the amplifier transistor 114, the threshold voltage Vtha of the amplifier transistor 114 can be set higher. Even when the threshold voltage Vths of the select transistor 115 is set lower than the threshold voltage Vtha, the select transistor 115 can be certainly turned on or off. Advantageously, the corresponding pixel can be selected with reliability by the select transistor 115 and 1/f noise in the amplifier transistor 114 can be reduced.

According to the present embodiment, an N channel MOS transistor is used as the amplifier transistor and, further, a buried channel MOS transistor is used as the NMOS amplifier transistor. The present invention is not limited to the above embodiment. A P channel MOS transistor can be used as the amplifier transistor and a buried channel MOS transistor can be used as the PMOS amplifier transistor. In the PMOS transistor, a P type corresponds to a first conductivity type and an N type corresponds to a second conductivity type. In other words, the conductivity pattern in FIG. 4 is reversed.

In addition, according to the present embodiment, the present invention is applied to an area sensor including a two-dimensional pixel array in which pixels are arranged in a matrix, each pixel including a photoelectric conversion element and an amplifier transistor for amplifying a signal indicating the potential corresponding to charge obtained by photoelectric conversion through the photoelectric conversion element and outputting the resultant signal. The application of the present invention is not limited to area sensors. The present invention can also be applied to linear sensors (line sensors) including linearly (one-dimensionally) arranged pixels, each pixel having the same configuration as that in the two-dimensional pixel array.

Figure 11:
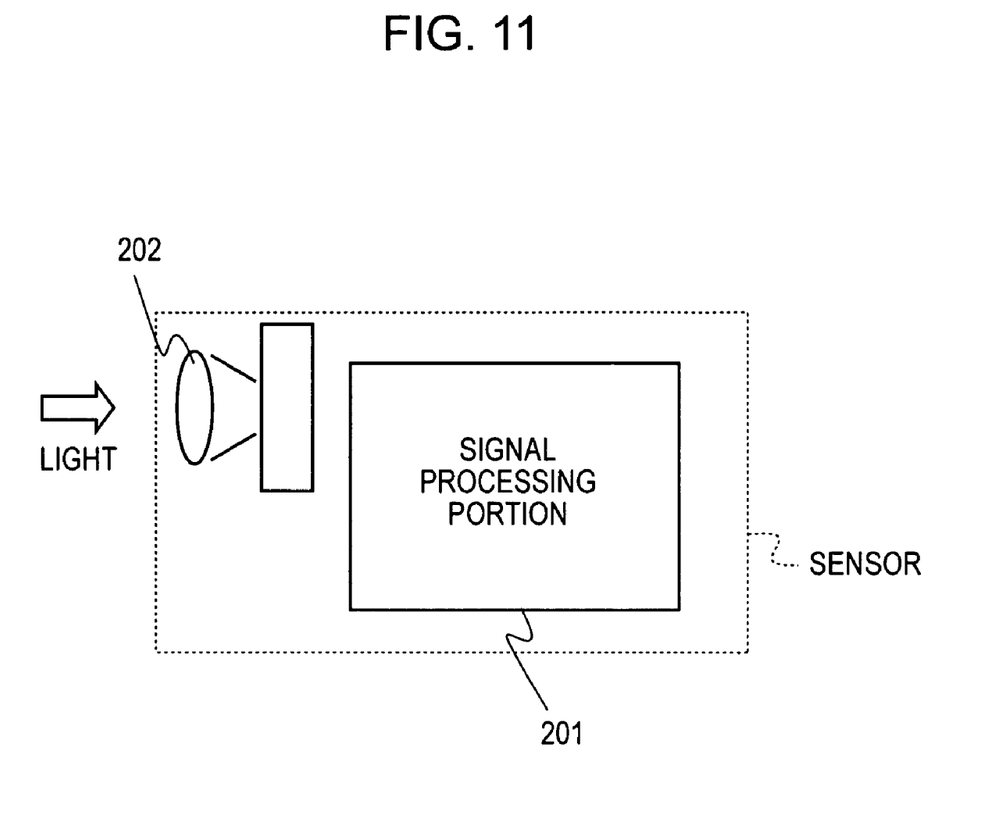

Also, the present invention may be applied to a solid-state imaging apparatus, like a camera, a camera module, a mobile phone, or a personal digital assistant (PDA), as is described in FIG. 11. The solid-state imaging apparatus may include a signal processing portion 201 which processes image signals and an optical system 202 which conducts incident light to an imaging area. In that case, the solid-state imaging apparatus can capture a good quality image.

It should be understood by those skilled in the art that various modifications, combinations, sub-combinations and alterations may occur depending on design requirements and other factors insofar as they are within the scope of the appended claims or the equivalents thereof.

In the solid-state imaging device and solid-state imaging apparatus with the above structure, since a buried channel MOS transistor is used as the amplifier transistor, a region where the potential of a substrate is minimized, i.e., a region where a current flows is formed not at the interface between the gate insulating film of the transistor and the substrate but at a distance from the gate insulating film, i.e., inside the substrate. Consequently, if any trap level capturing or releasing electrons or holes exists at the interface between the gate insulating film and the substrate, the effect of the trap level on the current flowing through the channel can be inhibited. In other words, a fluctuation in current which is caused by the trap level and leads to the generation of 1/f noise can be prevented.

Generally, any buried channel MOS transistor is easily sensitive to the short channel effect that is caused by a reduction in the channel length (gate length). On the other hand, each unit pixel operates in an analog manner such that charge obtained by photoelectric conversion through the photoelectric conversion element is transferred to a floating diffusion region, a signal indicating the potential, corresponding to the charge, of the floating diffusion region is amplified by the amplifier transistor, and the resultant signal is output to the corresponding signal line. Since the short channel length of the amplifier transistor leads to a fluctuation in threshold voltage Vth, a MOS transistor with a long channel length is used as the amplifier transistor. Accordingly, a buried channel MOS transistor, which is easily affected by the short channel effect, can be used as the amplifier transistor.

According to the present invention, the use of a buried channel MOS transistor, serving as an amplifier transistor, can inhibit the effect of any trap level at the interface between the gate insulating film and the substrate on a current flowing through the channel. Advantageously, 1/f noise can be basically reduced without increasing the gate length L, the active region width W, the gate insulating film capacitance Cox of the transistor.

What is claimed is:

1. A solid-state imaging device including an array of unit pixels, each unit pixel comprising:
   a photoelectric conversion element; and
   an amplifier transistor for amplifying a signal corresponding to charge obtained by photoelectric conversion through the photoelectric conversion element, wherein
   the amplifier transistor is a buried channel MOS transistor comprised of three terminals including a source, drain, and gate terminal, the buried channel extending under the gate terminal and from the source terminal to the drain terminal,
   wherein at least two different first conductivity type impurities having different diffusion coefficients are implanted into the buried channel region of the amplifier transistor, and
   the impurities are distributed such that a density of the implanted impurity with the lower diffusion coefficient is higher than the density of the implanted impurity with the higher diffusion coefficient in a region of the buried channel closest to the gate insulating film of the amplifier transistor, and further wherein a gate-source voltage is less than 1.5 volts and the amplifier transistor is a MOS transistor comprising a channel of a first conductivity type, the gate electrode of the transistor comprises polysilicon of a second conductivity type different than the first conductivity type.

2. The solid-state imaging device according to claim 1, wherein the amplifier transistor has a source follower configuration.

3. The solid-state imaging device according to claim 1, wherein
   each unit pixel further includes:
   a transfer transistor for transferring charge obtained by photoelectric conversion through the photoelectric conversion element to a floating diffusion region; and
   a reset transistor for resetting the potential of the floating diffusion region.

4. The solid-state imaging device according to claim 1, wherein
   each unit pixel further includes:
   a transfer transistor for transferring charge obtained by photoelectric conversion through the photoelectric conversion element to a floating diffusion region;
   a reset transistor for resetting the potential of the floating diffusion region; and
   a select transistor, connected in series to the amplifier transistor, for selecting the pixel.

5. The solid-state imaging device according to claim 1, wherein said two different first conductivity type impurities are arsenic and phosphorous.

6. The solid-state imaging device according to claim 1, wherein said array of unit pixels is a 1-D line array.

7. The solid-state imaging device according to claim 1, wherein said array of unit pixels is a 2-D matrix array.

8. A solid-state imaging apparatus including an array of unit pixels and a signal processing portion which processes image signals from the array of unit pixels, each unit pixel comprising:
- a photoelectric conversion element; and
- an amplifier transistor for amplifying a signal corresponding to charge obtained by photoelectric conversion through the photoelectric conversion element, wherein
- the amplifier transistor is a buried channel MOS transistor comprised of three terminals including a source, drain, and gate terminal, the buried channel extending under the gate terminal and from the source terminal to the drain terminal,
- wherein at least two different first conductivity type impurities having different diffusion coefficients are implanted into the buried channel region of the amplifier transistor, and
- the impurity with a lower diffusion coefficient is distributed such that the density of the impurity having the lower diffusion coefficient is higher than that of the impurity with a higher diffusion coefficient in a region of the buried channel closest to the gate insulating film of the amplifier transistor, and further wherein a gate-source voltage is less than 1.5 volts and the amplifier transistor is a MOS transistor comprising a channel of a first conductivity type, the gate electrode of the transistor comprises polysilicon of a second conductivity type different than the first conductivity type.

9. A solid-state imaging apparatus including an array of unit pixels, each unit pixel comprising:
- a photoelectric conversion element; and
- an amplifier transistor for amplifying a signal corresponding to charge obtained by photoelectric conversion through the photoelectric conversion element,
- wherein the amplifier transistor is a buried channel MOS transistor comprised of three terminals including a source, drain, and gate terminal, the buried channel extending under the gate terminal and from the source terminal to the drain terminal,
- wherein at least two different first conductivity type impurities having different diffusion coefficients are implanted for the buried channel of the amplifier transistor, and the impurity with a lower diffusion coefficient is distributed such that the density of the impurity with a lower diffusion coefficient is higher than that of the impurity with a higher diffusion coefficient in a region of the buried channel that is farthest from the gate insulating film of the amplifier transistor, and further wherein a gate-source voltage is less than 1.5 volts and the amplifier transistor is a MOS transistor comprising a channel of a first conductivity type, the gate electrode of the transistor comprises polysilicon of a second conductivity type different than the first conductivity type.

10. The solid-state imaging device according to claim 9, wherein the amplifier transistor is a MOS transistor comprising a channel of a first conductivity type, the gate electrode of the transistor comprises polysilicon of a second conductivity type different than the first conductivity type.

11. The solid-state imaging device according to claim 9, wherein the amplifier transistor has a source follower configuration.

12. The solid-state imaging device according to claim 9, wherein each unit pixel further includes:
- a transfer transistor for transferring charge obtained by photoelectric conversion through the photoelectric conversion element to a floating diffusion region; and
- a reset transistor for resetting the potential of the floating diffusion region.

13. The solid-state imaging device according to claim 9, wherein each unit pixel further includes:
- a transfer transistor for transferring charge obtained by photoelectric conversion through the photoelectric conversion element to a floating diffusion region;
- a reset transistor for resetting the potential of the floating diffusion region; and
- a select transistor connected in series to the amplifier transistor for selecting the pixel.

14. A solid-state imaging apparatus including an array of unit pixels and a signal processing portion which processes image signals from the array of unit pixels, each unit pixel comprising:
- a photoelectric conversion element; and
- an amplifier transistor for amplifying a signal corresponding to charge obtained by photoelectric conversion through the photoelectric conversion element,
- wherein the amplifier transistor is a buried channel MOS transistor comprised of three terminals including a source, drain, and gate terminal, the buried channel extending under the gate terminal and from the source terminal to the drain terminal,
- wherein at least two different first conductivity type impurities having different diffusion coefficients are implanted for the amplifier transistor, and the impurity with a lower diffusion coefficient is distributed such that the density of the impurity with a lower diffusion is higher than that of the impurity with a higher diffusion coefficient in a region of the buried channel that is farthest from the gate insulating film of the amplifier transistor, and further wherein a gate-source voltage is less than 1.5 volts and the amplifier transistor is a MOS transistor comprising a channel of a first conductivity type, the gate electrode of the transistor comprises polysilicon of a second conductivity type different than the first conductivity type.

15. The solid-state imaging device according to claim 14, wherein a total impurity implanted in the channel is equal to or higher than $1 \times 10^{19}$ atoms/cm$^3$.

16. The solid-state imaging device according to claim 4, wherein the threshold voltage of the select transistor is Vths and the threshold voltage of the amplifier transistor is Vtha, and Vths<Vtha.

* * * * *